United States Patent
de Rooij et al.

(10) Patent No.: US 8,378,656 B2
(45) Date of Patent: Feb. 19, 2013

(54) QUASI-AC, PHOTOVOLTAIC MODULE FOR UNFOLDER PHOTOVOLTAIC INVERTER

(75) Inventors: Michael Andrew de Rooij, Schenectady, NY (US); John Stanley Glaser, Niskayuna, NY (US); Oliver Gerhard Mayer, Munich (DE); Said Farouk Said El-Barbari, Freising (DE)

(73) Assignee: General Electric Company, Niskayuna, NY (US)

( * ) Notice: Subject to any disclaimer, the term of this patent is extended or adjusted under 35 U.S.C. 154(b) by 407 days.

(21) Appl. No.: 12/284,296

(22) Filed: Sep. 19, 2008

(65) Prior Publication Data

US 2010/0071742 A1 Mar. 25, 2010

(51) Int. Cl.
*G05F 1/40* (2006.01)
(52) U.S. Cl. .......................... 323/288; 323/285; 323/242
(58) Field of Classification Search .......... 136/243–251; 323/288, 285, 225, 268, 282, 283
See application file for complete search history.

(56) References Cited

U.S. PATENT DOCUMENTS

| | | | | |
|---|---|---|---|---|
| 4,626,983 | A | 12/1986 | Harada et al. ................. | 363/132 |
| 4,978,965 | A * | 12/1990 | Mohuchy ...................... | 343/727 |
| 5,473,528 | A | 12/1995 | Hirata et al. .................... | 363/71 |
| 5,898,585 | A | 4/1999 | Sirichote et al. ............. | 363/132 |
| 6,201,180 | B1 | 3/2001 | Meyer et al. .................. | 136/244 |
| 6,339,538 | B1 | 1/2002 | Handleman ..................... | 363/95 |
| 6,452,289 | B1 | 9/2002 | Lansberry et al. ............. | 307/25 |
| 6,465,724 | B1 | 10/2002 | Garvison et al. ............. | 136/244 |
| 6,919,714 | B2 | 7/2005 | Delepaut ....................... | 323/284 |
| 7,009,859 | B2 | 3/2006 | Chen et al. ...................... | 363/65 |
| 7,158,395 | B2 | 1/2007 | Deng et al. ..................... | 363/95 |
| 7,319,313 | B2 * | 1/2008 | Dickerson et al. ............. | 323/288 |
| 7,339,287 | B2 | 3/2008 | Jepsen et al. .................... | 307/82 |
| 7,521,914 | B2 * | 4/2009 | Dickerson et al. ............. | 323/288 |

(Continued)

FOREIGN PATENT DOCUMENTS

WO WO 01/45179 A1 6/2001
WO WO 03/036688 A2 5/2003

(Continued)

OTHER PUBLICATIONS

Li et al., A Current Fed Two-Inductor Boost Converter Grid Interactive Photovoltaic Applications, Australiasian Universities Power Engineering Conference, Brisbane, Australia, pp. 1-6, Sep. 2004.*

(Continued)

*Primary Examiner* — Jennifer Michener
*Assistant Examiner* — Jayne Mershon
(74) *Attorney, Agent, or Firm* — Ann M. Agosti

(57) ABSTRACT

A photovoltaic (PV) energy system includes a pulsed bus defined by a non-zero average value voltage that is proportional to a rectified utility grid AC supply voltage. The PV energy system also includes a plurality of PV modules, each PV module including a bucking circuit configured to convert a corresponding PV voltage into a pulsing current, wherein the pulsating bus is configured to sum the pulsing currents produced via the plurality of PV modules such that a resultant pulsing current is injected into the pulsating bus in phase with the non-zero average value voltage. A current unfolding circuit is configured to control the amount of AC current injected into the utility grid in response to the resultant pulsing current.

21 Claims, 7 Drawing Sheets

U.S. PATENT DOCUMENTS

| | | | | |
|---|---|---|---|---|
| 2003/0111103 | A1 | 6/2003 | Bower et al. | 136/244 |
| 2005/0121067 | A1* | 6/2005 | Toyomura et al. | 136/244 |
| 2007/0034246 | A1* | 2/2007 | Nakata | 136/244 |
| 2007/0103108 | A1 | 5/2007 | Capp et al. | 320/101 |
| 2007/0165347 | A1 | 7/2007 | Wendt et al. | 361/92 |
| 2007/0221266 | A1* | 9/2007 | Davies et al. | 136/244 |
| 2009/0020151 | A1* | 1/2009 | Fornage | 136/248 |
| 2010/0000165 | A1* | 1/2010 | Koller | 52/173.3 |

FOREIGN PATENT DOCUMENTS

| | | | |
|---|---|---|---|
| WO | WO 2008/028677 | * | 3/2008 |

OTHER PUBLICATIONS

Nema et al., Inverter Topologies and Control Structure in Photovoltaic Applications: A Review, Journal of Renewable and Sustainable Energy, vol. 3, 012701-1-23, 2011.*

Hegarty, Benefits of Mulitphasing Buck Converters—Part 1, EE Times (www.eetimes.com), Design, pp. 1-7, 2007.*

Baba, Benefits of a Multiphase Buck Converter, Analog Applications Jorunal, High Performance Analog Products, Texas Instruments, pp. 1-8, 2012.*

Prof. Rik W. Ed Doncker, "Power Converter for PV-Systems", ECPE Seminar: Renewable Energies, Institute for Power Electronics and Electrical Drives (ISEA), RWTH Aachen University, 18pp, Feb. 9-10, 2006.

Eduardo Román, Ricardo Alonso, Pedro Ibañez, Intelligent PV Module for Grid-Connected PV Systems, *IEEE Transactions on Industrial Electronics*, Vo. 53, No. 4, pp. 1066-1073, Aug. 2006.

A.R. Turner, S. Sathiakumar, Y.S. Lee, "Injecting Power from a Small Wind Turbine into a DC Bus", 2004 International Conference on Power Systems Technology—POWERCON 2004, Singapore 21-24, pp. 1078-1083, Nov. 2004.

Yaow-Ming Chen, Chung-Sheng Cheng, Hsu-Chin Wu, "Grid-Connected Hybrid PV/Wind Power Generation System with Improved DC Bus Voltage Regulation Strategy", Department of Electrical Engineering, National Chung Cheng University, (2006).

* cited by examiner

QUASI-AC, PHOTOVOLTAIC MODULE FOR UNFOLDER PHOTOVOLTAIC INVERTER

BACKGROUND

The invention relates generally to electronic power conversion and more particularly to a quasi-AC, photovoltaic (PV) module for an unfolder PV inverter.

Photovoltaic (PV) cells generate direct current (DC) power with the level of DC current being dependent on solar irradiation and the level of DC voltage inversely dependent on temperature. When alternating current (AC) power is desired, an inverter is used to convert the DC energy into AC energy. Typical PV inverters employ two stages for power processing with the first stage configured for providing a constant DC voltage and the second stage configured for converting the constant DC voltage to AC current. Often, the first stage includes a boost converter, and the second stage includes a single-phase or three-phase inverter system. The efficiency of the two-stage inverter is an important parameter affecting PV system performance and is a product of the individual stage efficiencies.

Single phase photovoltaic inverters generally require a two-stage conversion power circuit to convert the varying DC voltage of a PV array to the fixed frequency AC-voltage of the grid. Traditional PV inverters use a DC link as the intermediate energy storage step, which means that the converter first converts the PV array voltage to a stable DC voltage then to a current that can be injected into the grid.

Traditional single phase PV inverters also undesirably control the power circuits with a fixed switching frequency using a plurality of switching devices that contribute to the overall switching losses. Switching losses are typically kept as low as possible when using traditional PV inverters by keeping the switching frequency low.

A photovoltaic generator can include many PV modules that are connected in series and parallel to form a solar generator. PV modules can lose their ability to produce power due to shading effects caused by tall objects, leaves, dust, snow, and so on. A photovoltaic generator delivers its maximum power by selecting a proper operational voltage maximum power point. Maximum power point tracking however, works well only under optimum, non-shaded conditions. As soon as parts of a PV module (one cell is enough) are covered by snow, dust, leaves, and the like, the PV generator can lose a significant portion its power.

It would be both advantageous and beneficial to provide a residential photovoltaic (PV) energy system that is easier to install, is less expensive, and has a higher efficiency than that associated with traditional PV inverters. It would be further advantageous if the PV energy system could operate in the absence of a DC disconnect mechanism. It would be further advantageous if the PV energy system could be configured to allow each PV module to operate at a corresponding operational point that is dependent upon its shading conditions.

It would be further advantageous if modules of various powers could effortlessly be combined in a system and if each quasi AC module were backward compatible when presented with a DC load voltage, further making it suitable for three-phase systems that draw constant power.

It would be further advantageous if each quasi AC module were controllable by using simple off the shelf unity power factor regulator ICs, ensuring simplicity.

Additional advantages of such a PV energy system would include, without limitation, the ability to mix different power modules in a system and also thereby maximize available roof area for energy generation, an efficiency gain over the AC module concept, no voltage on the output during installation making is safer than convention systems to install, provision of an array that can be mounted multi-directional e.g. on an igloo, and mini PV cell converters in a module, each producing pulsing current in which various configurations are possible e.g. one converter per 4 cells etc.

BRIEF DESCRIPTION

Briefly, in accordance with one embodiment, a photovoltaic (PV) energy system comprises:
 a pulsating bus defined by a non-zero average value voltage that is proportional to a rectified utility grid AC supply voltage;
 at least one PV module comprising a PV generator with a converter configured to convert a PV voltage into a pulsing current that is injected into the pulsing bus; and
 a current unfolding circuit configured to control the polarity of AC current injected into the utility grid in response to the injected pulsing current such that power generated by the at least one PV module is transferred to the utility grid.

DRAWINGS

These and other features, aspects, and advantages of the present invention will become better understood when the following detailed description is read with reference to the accompanying drawings in which like characters represent like parts throughout the drawings, wherein.

While the above-identified drawing figures set forth alternative embodiments, other embodiments of the present invention are also contemplated, as noted in the discussion. In all cases, this disclosure presents illustrated embodiments of the present invention by way of representation and not limitation. Numerous other modifications and embodiments can be devised by those skilled in the art which fall within the scope and spirit of the principles of this invention.

DETAILED DESCRIPTION

Figure 1:
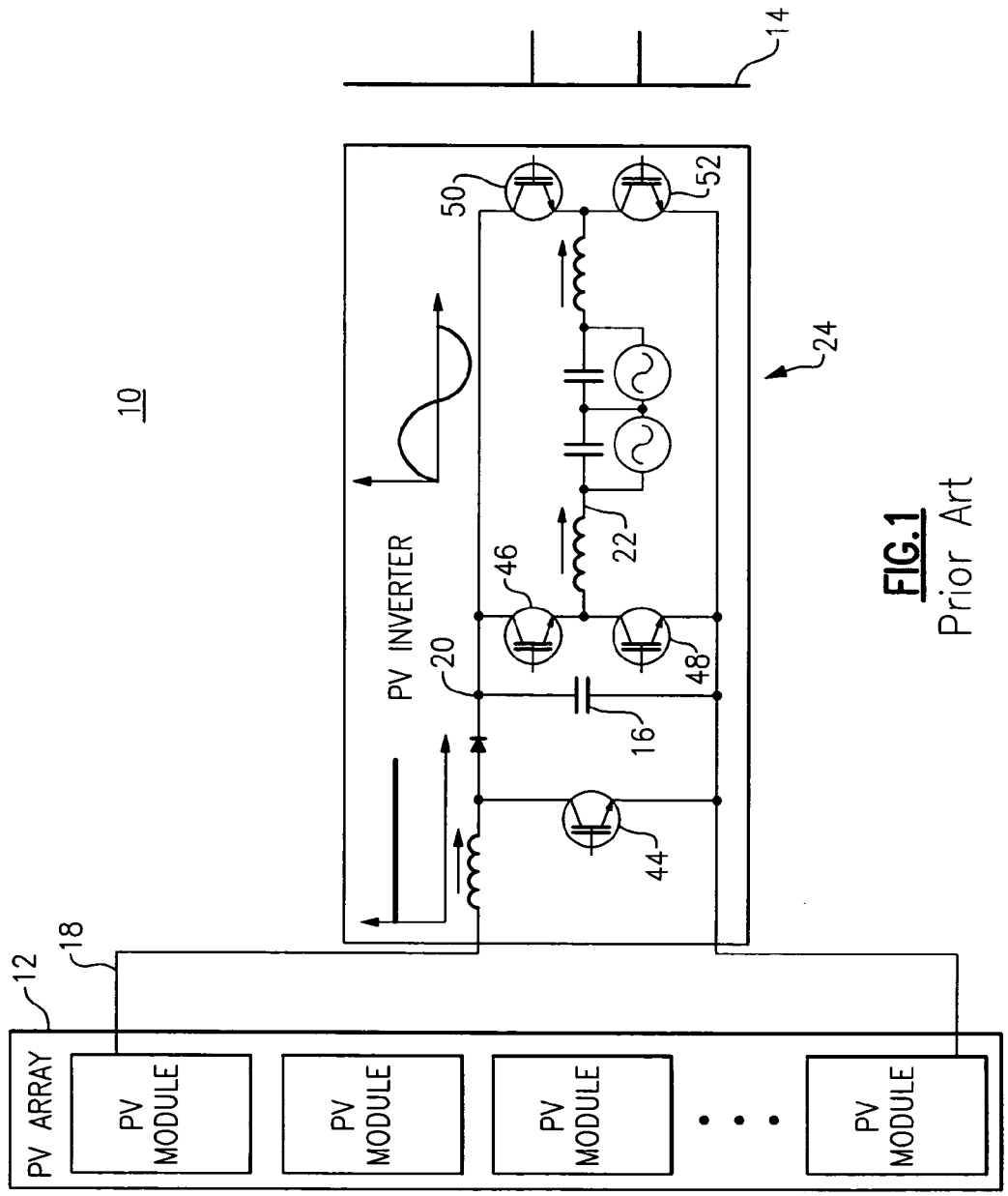
FIG. 1 illustrates a photovoltaic inverter topology that is known in the art.

FIG. 1 is illustrates a photovoltaic inverter 10 topology that is known in the art. Photovoltaic (PV) inverter 10 employs a two-stage power circuit to convert a varying DC voltage of a PV array 12 to a fixed frequency AC voltage for a power grid 14. Photovoltaic inverter 10 uses a DC link capacitor 16 to implement the intermediate energy storage step. This means the PV inverter 10 first converts the unstable PV DC voltage 18 to a stable DC voltage 20 that is greater than the grid voltage via a boost converter, and subsequently converts the stable DC voltage 20 to a current 22 via a PWM circuit 24 that can then be injected into the grid 14. Photovoltaic inverter 10 topology employs five switching devices 44, 46, 48, 50, 52 that are all switching at a high frequency and that undesirably contribute to the overall switching losses of the two-stage converter.

Figure 2:
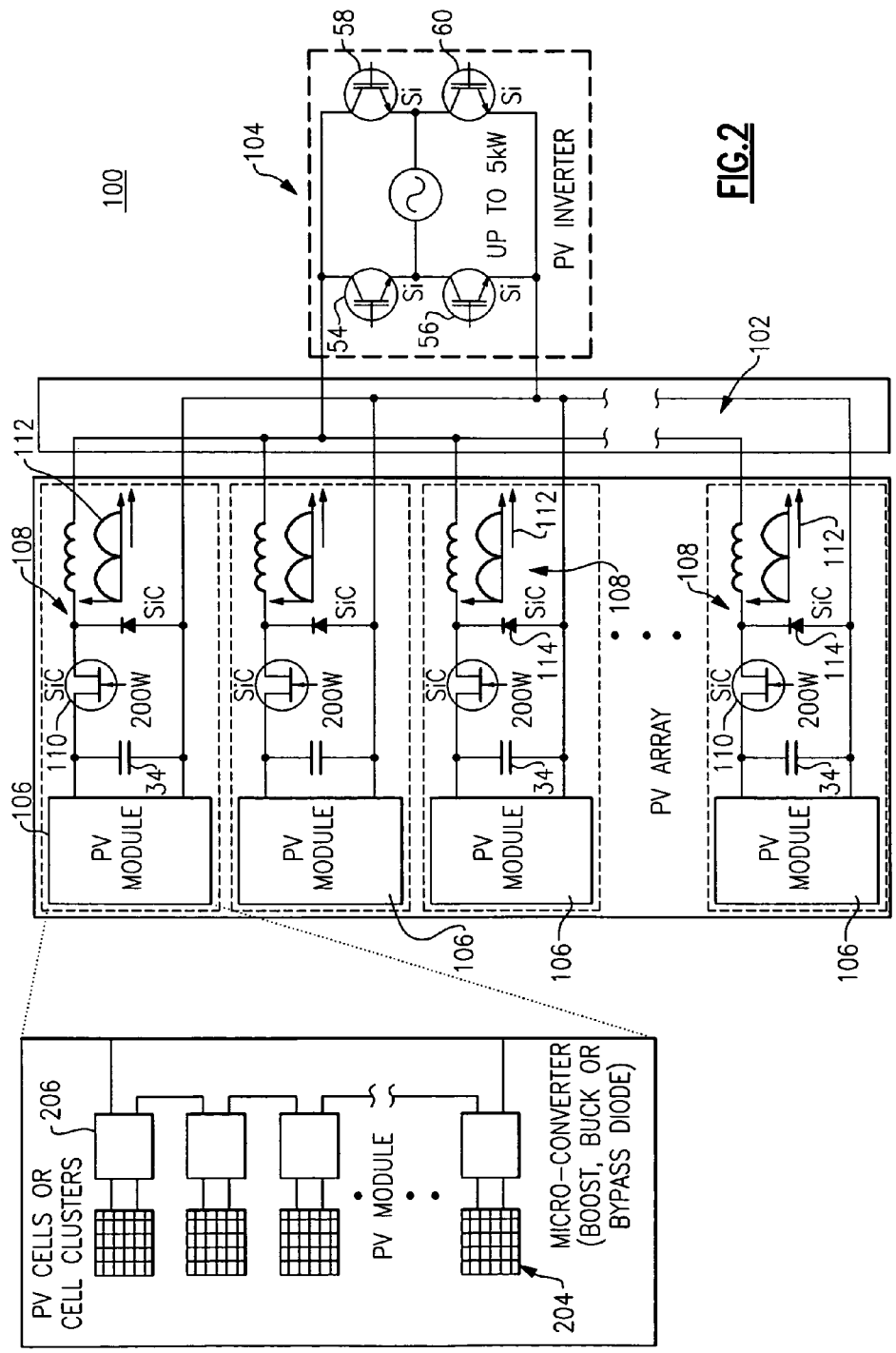
FIG. 2 is illustrates a photovoltaic energy system in accordance with one embodiment of the invention.

FIG. 2 is illustrates a photovoltaic (PV) energy system 100 in accordance with one embodiment of the invention. PV energy system 100 employs a topology that simplifies installation, improves efficiency and reduces cost beyond that achievable with the system topology depicted in FIG. 1.

PV energy system 100 includes a pulsating bus 102 that is defined by a non-zero average value voltage that is proportional to a rectified utility grid AC supply voltage and that is described in further detail below with reference to FIG. 3. The pulsating bus 102 is derived by rectification of a main utility grid supply voltage via a PV inverter 104 that is connected to the main utility grid; and all current injected into the bus 102 via the PV modules 106 is in phase with this voltage and closely matches the voltage waveform. The PV inverter 104 simply becomes an unfolding circuit.

Figure 9:
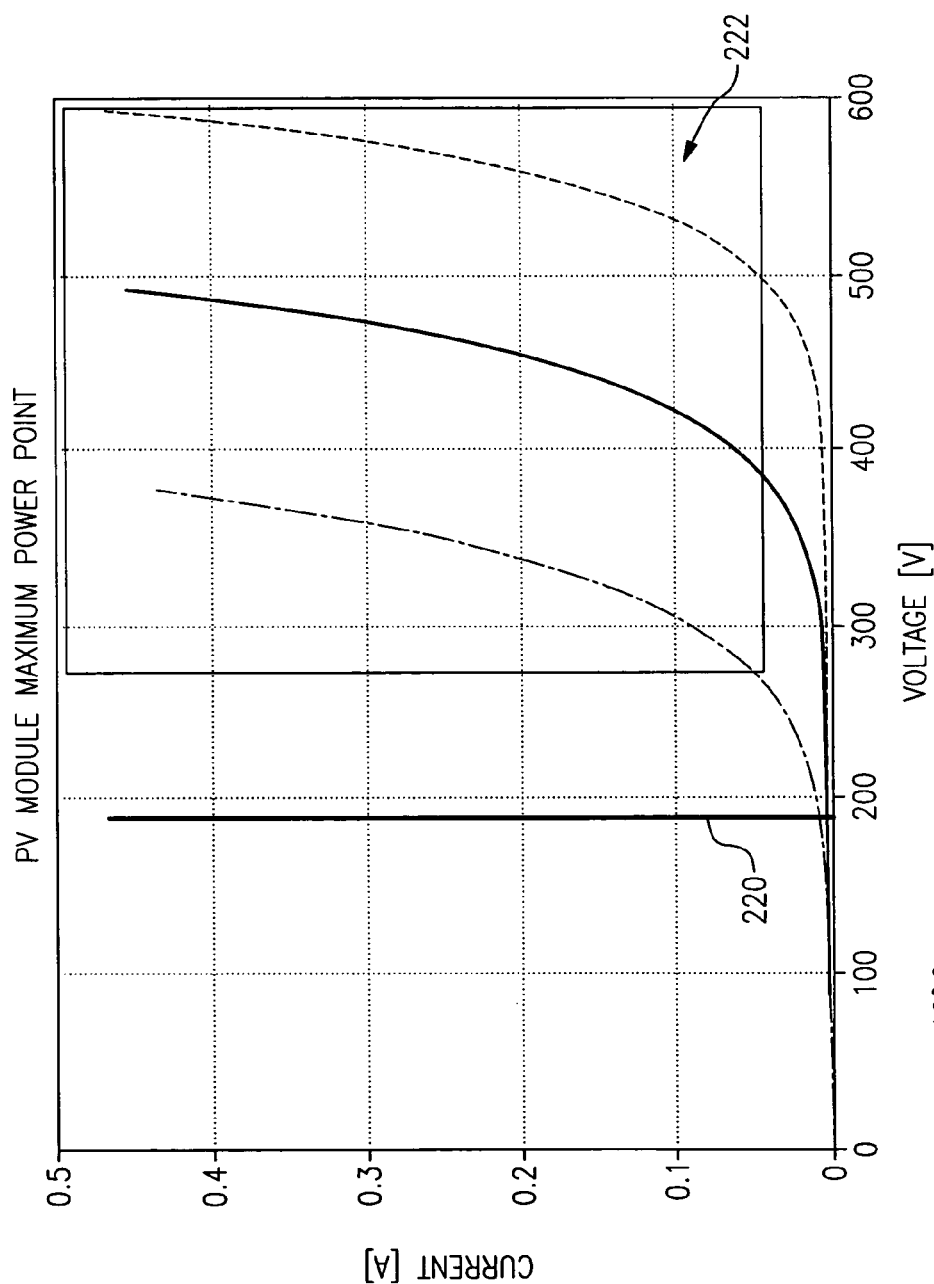
FIG. 9 illustrates an operating region for photovoltaic cells arranged into high voltage PV modules capable of delivering a PV voltage that is always larger in magnitude than a peak mains grid voltage, according to one embodiment of the invention.

The PV energy system 100 topology is particularly advantageous when the photovoltaic cells are arranged using high voltage PV modules 106 capable of delivering a PV voltage that is always larger in magnitude than the peak mains grid voltage 220 such as depicted for one embodiment in FIG. 9 that illustrates a PV module operating region of interest 222. Each PV module 106 is configured to operate with a corresponding bucking circuit 108 that converts the PV module 106 voltage (power) into a pulsing current that is injected into the pulsating bus 102.

Although similar to an AC module, PV module 106 together with its corresponding bucking circuit 108 does not generate AC or DC, but instead generates a quasi AC. Since the PV modules 106 are configured such that they cannot produce energy in the absence of the voltage on the pulsating bus 102, no DC disconnect capability is required and the PV modules are therefore cheaper and easier to implement. Further, the disconnect can be centrally located (inverter-unfolder).

Further the PV modules 106 that are each integrated with a respective bucking circuit 108 provide a topology that requires very low power and only a single switching device 110. The conversion efficiency of each bucking circuit 108 is very high, producing very low heat. Each bucking circuit 108 employs only two active devices that can optionally be implemented using SiC devices that can tolerate higher temperature better than more conventionally used Si devices. Further, the active switch 110 for the buck converter 108 can be placed in the negative line of the PV module 106 to simplify the gate driver and control circuit, such as depicted in FIG. 4.

According to one aspect of the invention, a boosting circuit is not required for the high voltage module 106 case since the working maximum power voltage will always be above the peak of the grid voltage when the photovoltaic cells are arranged into high voltage PV modules capable of delivering a PV voltage that is always larger in magnitude than the peak mains grid voltage.

According to one aspect of the invention, the plurality of pulsing currents 112 generated via the PV modules 106 are summed together to produce a resultant pulsing current on the pulsed bus 102. The resultant pulsing current is then fed to the PV inverter/unfolder circuit 104 that controls the AC injected into the utility grid to which the unfolder circuit 104 is connected. The inverter/unfolder 104 employs a topology that can be made very efficient (~99%), requiring virtually no cooling and is very inexpensive to realize.

Figure 4:
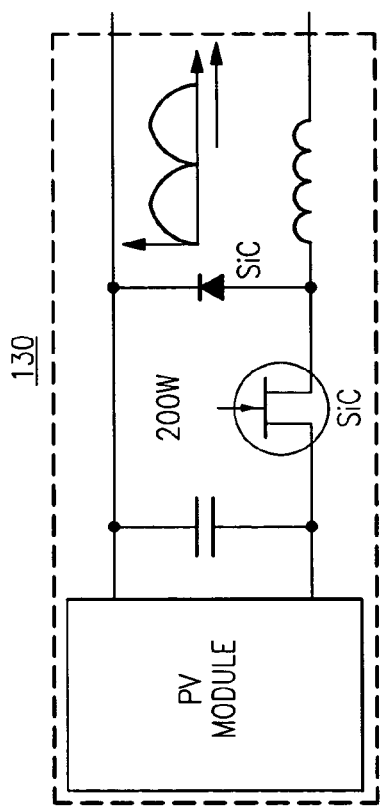
FIG. 4 is a schematic diagram illustrating a photovoltaic module integrated with a buck topology according to one embodiment of the invention.

Since each PV module is capable of operating at maximum power when configured as illustrated in FIG. 4, there is no need to design a PV array to accommodate a particular site. The PV energy system 100 is therefore extremely immune to the negative effects of shading common to more conventional topologies. The inherent shading immunity maintains the high conversion efficiency to harvest more KW hrs than possible when using a conventional system.

The PV energy system 100 topology generates additional cost savings during installation since a specialized electrician is no longer required for installation; and a DC disconnect is also no longer required. A DC disconnect is no longer required since the DC source is contained inside the PV module 106 and is not externally exposed.

PV modules 106 in a multiple PV module system can advantageously be configured with different power ratings from other PV modules while retaining interchangeability of PV modules in the absence of PV energy system modifications to accommodate the interchangeability of the PV modules such that the PV energy system maximizes available roof space used to attach the PV energy system. Further, the plurality of PV modules can be configured to provide a plurality of PV arrays having dissimilar directional orientations such that the PV energy system provides increased sun tracking capability and energy harvesting capability beyond that achievable with a conventional PV energy system having all PV modules oriented in the same direction.

The PV energy system according to one embodiment is configured such that each converter 108 and the current unfolding circuit 104 together are configured to be more energy conversion efficient than a conventional AC module converter. In another embodiment, each converter and the current unfolding circuit together are each configured to achieve an energy conversion efficiency of about 99%.

The PV energy system according to another embodiment is configured such that each PV module is configured to produce an output current only when the corresponding current unfolding circuit presents a voltage to the pulsating bus. In a further embodiment, each PV module converter comprises at least one of a buck converter, a boost converter, an isolated converter, or a boost converter with flyback capability. In yet another embodiment, each PV module converter is configured to be controlled via a simple and readily available off the shelf power factor regulator IC. In still another embodiment, each PV module is configured to deliver a PV voltage that is always larger in magnitude than the peak utility grid voltage. In still another embodiment, each PV module and the current unfolding circuit together are configured to provide compatibility with AC energy converters to provide energy conversion if the pulsating bus becomes DC. In still another embodiment, each PV module is configured to provide constant power suitable for use with three-phase PV energy systems.

Figure 3:
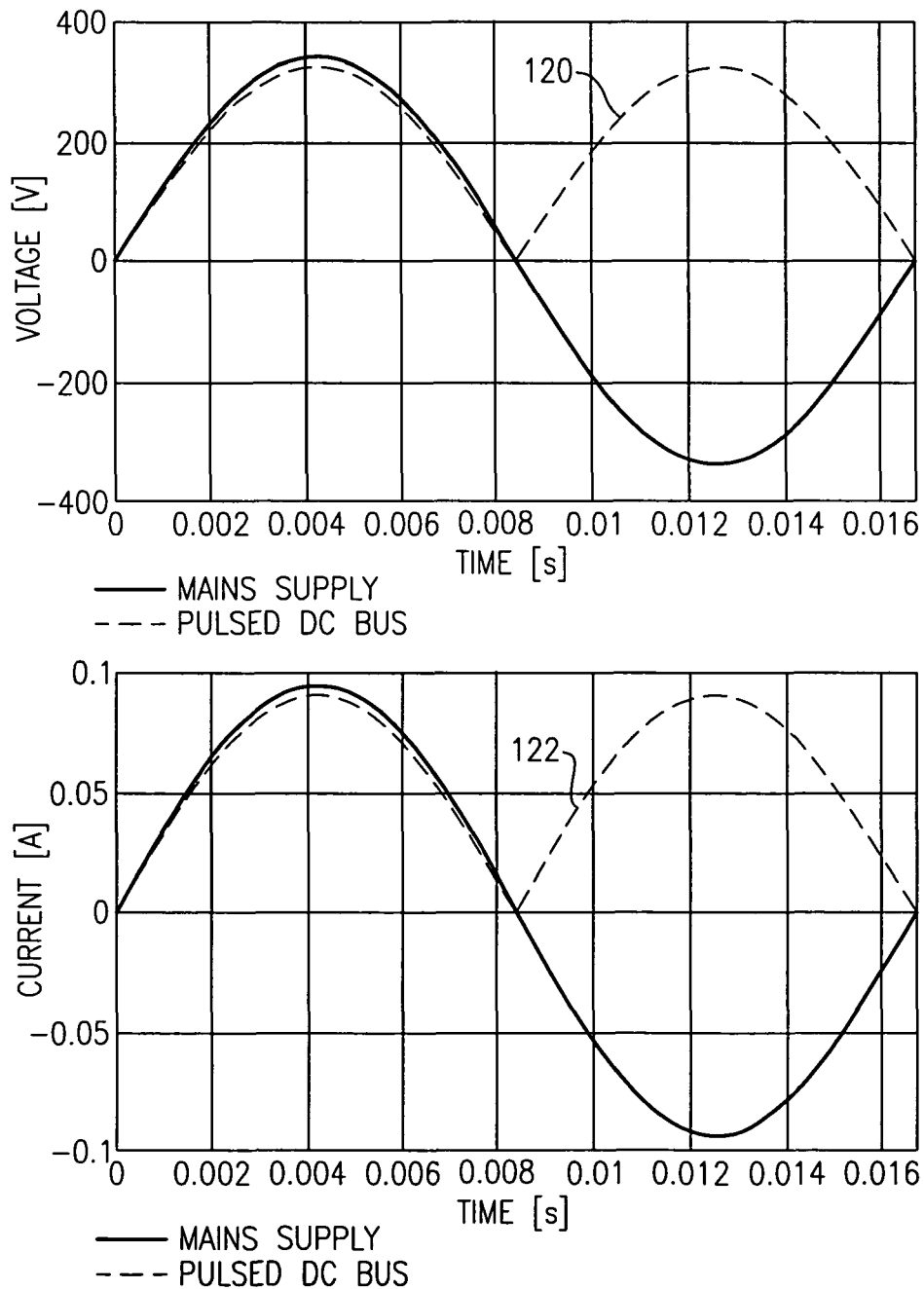
FIG. 3 illustrates a haver-sine voltage waveform and unity power factor current generated by a pulsed DC bus associated with a utility grid supply according to one embodiment of the invention.

FIG. 3 illustrates a haver-sine voltage waveform 120 and unity power factor current 122 generated by a pulsing bus associated with a utility grid supply according to one embodiment of the invention.

FIG. 4 is a schematic diagram illustrating a common voltage node PV module buck topology 130 according to one embodiment of the invention.

Figure 5:
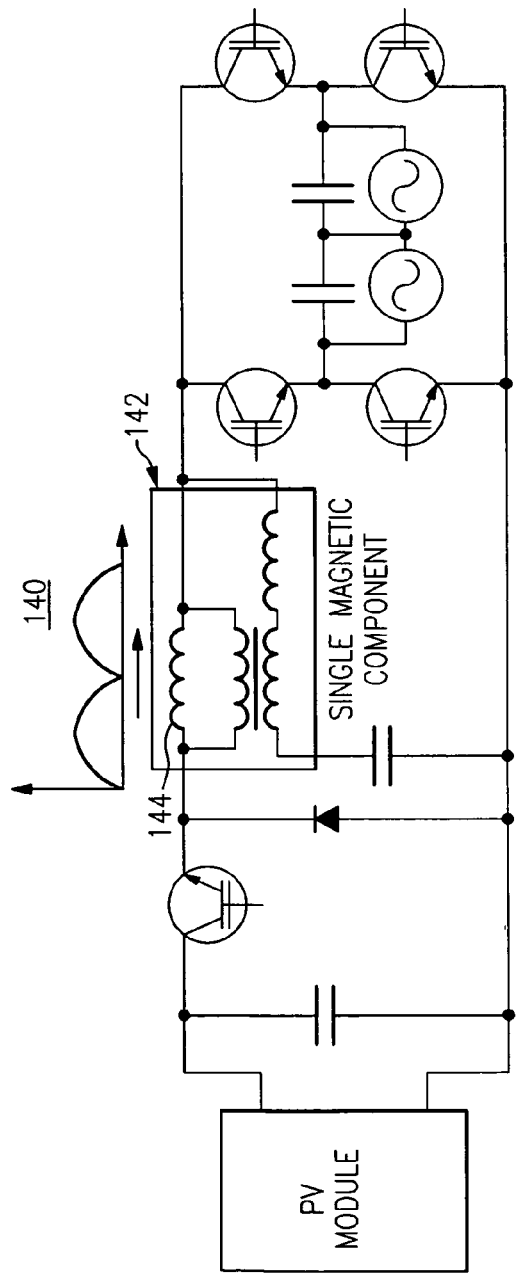
FIG. 5 illustrates a photovoltaic buck topology including a ripple current cancellation circuit to reduce the main buck inductor size while maintaining ripple specifications on a pulsed DC bus according to one embodiment of the invention.

FIG. 5 illustrates a PV buck topology 140 including a ripple current cancellation circuit 142 to reduce high frequency ripple on a pulsating bus according to one embodiment of the invention. Ripple current cancellation circuit 142 provides a means for reducing the main inductor 144 size without compromising the output ripple current requirements of the system. Ripple current cancellation circuit 142 allows use of a smaller inductor 144 having lower losses than that achievable with a larger inductor. Soft switching techniques can be employed to further reduce switching losses Looking again at FIG. 2, the photovoltaic energy system 100 topology overcomes the necessity to employ a DC link to implement an intermediate energy storage step such as described above with reference to FIG. 1, because bucking circuit 108 converts the PV array 12 voltage immediately into a quasi AC current 112. This feature is implemented by stiffening each leg of the PV array 12 with a large capacitance 34, effectively shifting the DC link to the PV array 12 thereby stabilizing the PV array output voltage during generation of the rectified grid current. The subsequent inverter stage 104 merely needs to unfold the current 112 into the grid 14, and does so without switching losses because the inverter stage switching devices 54, 56, 58, 60 switch only at the utility grid 14 low frequency at the zero voltage and current crossing points.

Each bucking circuit 108 can be seen to also include a bypass diode 114. Each bypass diode 114 operates to protect its corresponding PV module 106 during operating conditions when shading occurs and the PV module 106 cannot produce the requisite amount of energy necessary to operate the bucking circuit switching device 110. The bypass diode 114 protects the PV module 106 during shading conditions by allowing the PV module current to bypass the non-functioning PV module 106 and corresponding bucking circuit 108 without adversely impacting operating conditions associated with the PV modules 106 that remain unaffected by shading.

In summary explanation, a pulsating bus 102 is connected to a high voltage PV module 106 including a buck converter 108 that generates a pulsating current that is injected into the bus 102 in phase with the pulsating bus voltage and closely matches the voltage waveform. The buck converter 108 is a simple two active device circuit. Boosting is not required as the working maximum power voltage will always be above the peak of the grid voltage according to one aspect of the invention. The active switch for the buck converter 108 can be placed in the negative line of the PV module 106 to simplify the gate driver and control circuit.

Advantages provided by the PV energy system 100 include without limitation, provision of a ripple current cancellation circuit that ensures the buck converter 108 inductor 144 can be made small and to ensure that high frequency currents are sufficiently attenuated on the pulsating bus line. Further, the PV inverter/unfolder 104 simplifies to a simple unfolder circuit with very high conversion efficiency. The buck converter 108 for the PV module 106 can be realized using SiC devices that can tolerate higher temperatures better than Si devices, as stated above.

Additional advantages include, without limitation, 1) the capacitor energy storage requirements for the high voltage PV array system are significantly reduced so that higher reliability capacitors can be selected such as film capacitors on the front end of the buck converter 108; 2) ground fault detection can still be provided in the PV inverter/unfolder 104; and 3) if a converter capable of buck-boost operation, or if the buck converter 108 has a transformer as part of the converter, the PV energy system 100 will work with photovoltaic modules 106 whose voltage is less than the line voltage.

Still further advantages include, without limitation, 1) a concept that is simpler to practice than conventional systems, 2) a higher energy harvesting capability than possible with conventional systems, 3) reduced installation costs as DC wiring, requiring specially qualified electricians for installation has been eliminated, 4) a simplified PV array dimensioning (embedded into PV module), and 5) a PV inverter 104 that is highly efficient and therefore significantly more compact and also more reliable when compared to a conventional system.

Figure 6:
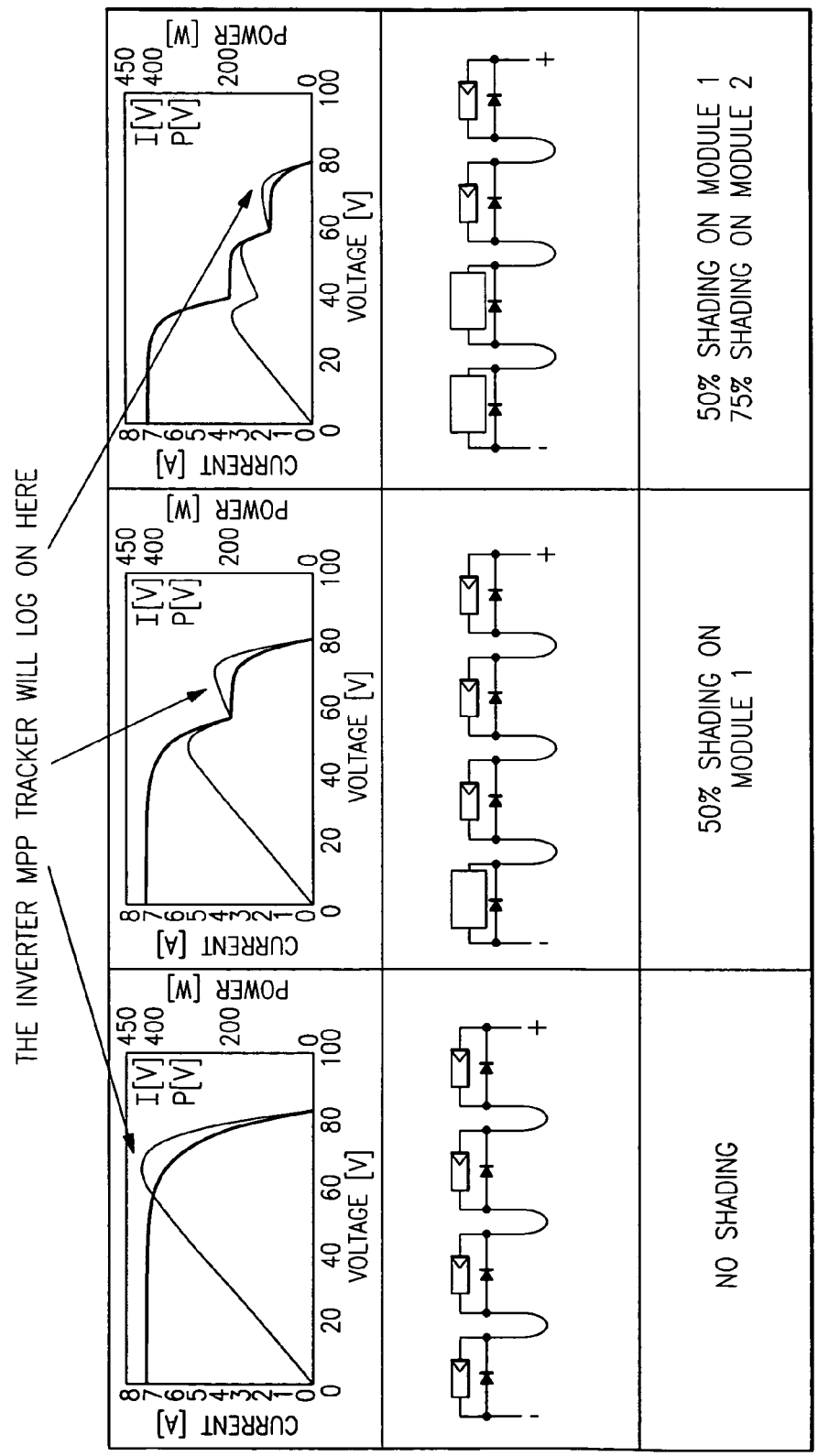
FIG. 6 illustrates the effects of shading on a string of photovoltaic modules.
Figure 7:
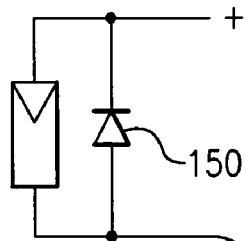
FIG. 7 illustrates a portion of a photovoltaic array that is known in the art.

Looking now at FIG. 6, the effects of shading are depicted for a string of conventional photovoltaic modules such as depicted as PV array 12 in FIG. 1. PV inverters have two tasks including operating the PV generator at its maximum power point, and transforming the DC power to AC power. Maximum power point tracking however, works well only under optimum, non-shaded conditions. As soon as parts of a PV module (one cell is enough) are covered by snow, dust, leaves, and the like, the PV generator loses a portion its power (up to 15% under certain conditions). When this condition occurs, a bypass diode, enumerated as 150 in FIG. 7, protects the PV module from exposure to high reverse voltage levels that can damage the PV module during the shading conditions.

Figure 8:
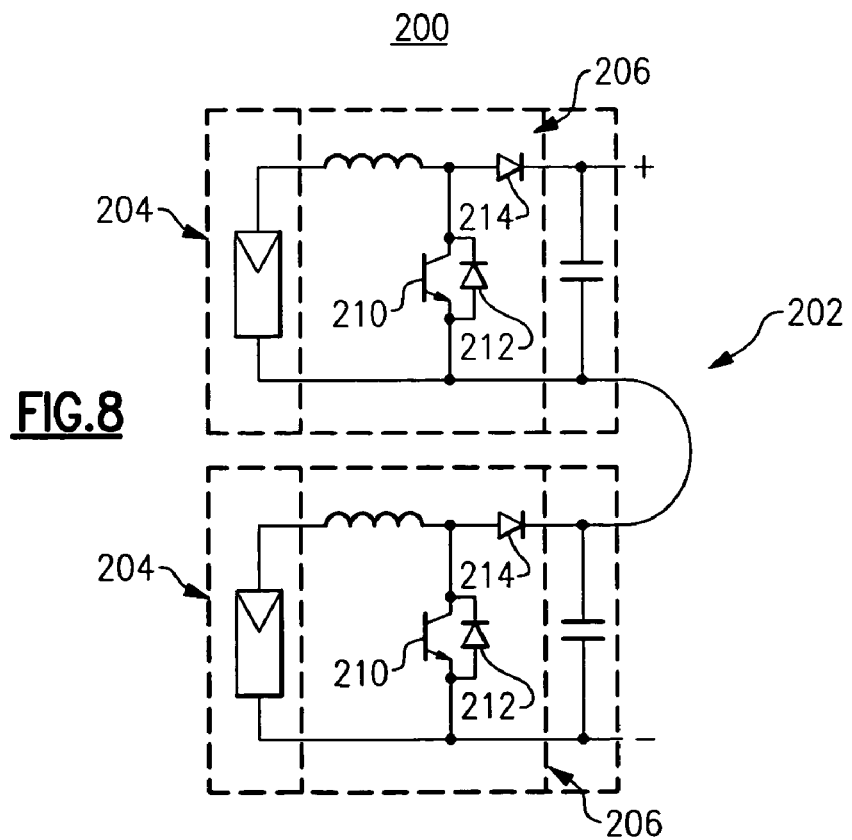
FIG. 8 illustrates a photovoltaic energy system in accordance with another embodiment of the invention.

FIG. 8 illustrates a photovoltaic energy system 200 in accordance with another embodiment of the invention. PV energy system 200 includes a PV array 202 including a plurality of PV modules 204 connected in series in which a DC/DC boost converter 206 is connected across each PV module 204. Each PV module 204 can include a single PV cell, an array of PV cells or multiple arrays of PV cells. The PV energy system 200 topology allows an individual operational point for every PV module 204, ensuring that the maximum power is always achieved for the PV array 202. If the switching transistor (e.g. MOSFET) 210 fails, the body diode 212 and the external diodes 214 provide operating behavior as usual, such as normally associated with the topology illustrated in FIG. 7.

The DC/DC boost converter topology described above with reference to FIG. 8 can easily be employed across individual PV cells or groups of PV cells to implement each PV module 106 illustrated in FIG. 2. The resultant architecture will ensure that photovoltaic cells are arranged into high voltage PV modules 106 capable of delivering a PV voltage that is always larger in magnitude than the peak mains grid voltage.

In all versions of the previously described embodiments, the AC utility voltage may not be purely sinusoidal due to the presence of harmonics. In such cases, the action of the unfolding circuit will not result in a haver-sine waveform on the pulsating bus, but rather a waveform representing the absolute value of the AC utility voltage.

In one case where the AC utility voltage is non-sinusoidal, the currents injected into the bus by the PV modules may be made proportional to the pulsating bus voltage.

In another case where the AC utility voltage is non-sinusoidal, the currents injected into the bus by the PV modules may be made proportional to a filtered version of the pulsed bus voltage. This filter would reject some frequency bands and allow others. One example of such a filter would pass DC and the frequency equal to twice the line frequencies, and optionally a finite number of harmonics thereof.

In one case where the AC utility voltage is non-sinusoidal, the currents injected into the bus by the PV modules may be made proportional to the absolute value of a filtered version of the AC utility voltage. In this case, the filter may be constructed to band-limit the signal, including the ability to reject DC. The filter may be constructed to allow only signals at the fundamental of the AC line. In any case, the filter may also be constructed such that the fundamental component of the current waveform injected into the utility grid by the unfolding circuit is proportional to the fundamental component of the AC utility grid voltage waveform.

The above can also be accomplished by unfolding a signal-level representation of the pulsed bus voltage such that the PV module itself can generate a copy of the utility voltage waveform from the bus voltage. This may then be filtered in the above manner. The advantage of this is that modules can now be self-contained without requiring a direct sample of the utility voltage. Note that when one unfolds the bus voltage, a phase error of 180 degrees with respect to the AC line is possible, assuming the actual line reference is not available. However, if the DC component of this representation approaches zero, as is typically the case for a utility voltage, or if any such DC component is removed with a filter, this phase shift is permissible, as once the absolute value of the filtered signal is taken, the 180 degree phase error is immaterial.

The advantage of using the filtering technique above is that one can improve the stability of the system, by allowing a response only to desired AC line voltage frequency component. This limits the chance for instability due to arbitrary loads.

A further advantage of using the filtering technique above is that one can improve the safety of the system, by allowing a response only to the fundamental frequency of the AC line voltage frequency component. Then, when the utility AC line voltage is absent, the converter produces no output to provide, for example, anti-islanding capability.

While only certain features of the invention have been illustrated and described herein, many modifications and changes will occur to those skilled in the art. It is, therefore, to be understood that the appended claims are intended to cover all such modifications and changes as fall within the true spirit of the invention.

The invention claimed is:

1. A photovoltaic (PV) energy system, the PV energy system comprising:
 a pulsating bus defined by a non-zero average value voltage that is proportional to a rectified utility grid AC supply voltage;
 a plurality of PV modules, each PV module comprising a stiffening capacitor and a PV generator with a corresponding voltage to current converter configured together to convert a PV voltage into a pulsing current that is injected into the pulsating bus, wherein each PV module is directly connected to the pulsating bus, and further wherein each voltage to current converter consists solely of a buck converter, or solely of a boost converter, or solely of an isolated converter, or solely of a boost converter with flyback capability, and further wherein each PV module is coupled to a corresponding voltage to current converter via a corresponding stiffening capacitor; and
 a current unfolding circuit configured to control the polarity of AC current injected into the utility grid in response to the injected pulsing currents such that power generated by the plurality of PV modules is transferred to the utility grid, wherein the current unfolding circuit is directly connected to the pulsating bus, and further wherein the current unfolding circuit is coupled to each PV module stiffening capacitor via the corresponding PV module voltage to current converters.

2. The PV energy system according to claim 1, wherein the pulsing current is defined by a haver-sine waveform that is proportional to an absolute value of a utility grid AC voltage in response to an AC utility grid voltage that is not purely sinusoidal and whose amplitude is defined by the available power from at least one PV generator and the amplitude of AC voltage.

3. The PV energy system according to claim 1, wherein the pulsing current is proportional to an absolute of a utility grid AC voltage in response to a utility grid voltage that is non-sinusoidal and whose amplitude is defined by the available power from at least one PV generator and the amplitude of AC voltage.

4. The PV energy system according to claim 1, wherein the pulsing current is proportional to the pulsating bus voltage in response to a non-sinusoidal utility grid voltage and whose amplitude is defined by the available power from at least one PV generator and the amplitude of AC voltage.

5. The PV energy system according to claim 1, wherein the pulsing current is proportional to a filtered version of the pulsating bus voltage in response to a non-sinusoidal utility grid voltage and whose amplitude is defined by the available power from at least one PV generator and the amplitude of AC voltage.

6. The PV energy system according to claim 1, wherein the pulsing current comprises a fundamental component that is proportional to a fundamental component of the utility grid voltage waveform and whose amplitude is defined by the available power from at least one PV generator and the amplitude of AC voltage.

7. The PV energy system according to claim 1, wherein the pulsing current is proportional to an absolute value of a filtered version of the utility grid voltage in response to a non-sinusoidal utility grid voltage and whose amplitude is defined by the available power from at least one PV generator and the amplitude of the utility voltage.

8. The PV energy system according to claim 7, wherein the non-sinusoidal utility grid voltage comprises a representation of the utility grid voltage based on the pulsating bus voltage.

9. The PV energy system according to claim 1, wherein each converter is configured to be controlled via a simple and readily available off the shelf power factor regulator IC.

10. The PV energy system according to claim 1, wherein at least one PV module is operationally connected to the pulsating voltage bus.

11. The PV energy system according to claim 1, wherein each converter can be sub divided for each PV cell of the corresponding PV generator or clusters of cells of the corresponding PV generator.

12. The PV energy system according to claim 11, wherein each converter comprises a bucking or boosting circuit including a buck or anti-parallel diode configured to also function as a bypass diode configured to protect at least one PV cell or PV cell cluster to which it is connected from exposure to excessive voltage during shading from the remaining PV cells in the generator.

13. The PV energy system according to claim 12, wherein the bypass diode is further configured to ensure its corresponding PV module remains operational during a bucking or boosting circuit switch failure caused by a short, open or partial switch failure.

14. The PV energy system according to claim 1, wherein each PV module is configured to operate only when the current unfolding circuit is connected to its corresponding converter.

15. The PV energy system according to claim 1, wherein the current unfolding circuit is further configured to generate the non-zero average value voltage in response to the main utility grid supply voltage.

16. The PV energy system according to claim 1, wherein each converter comprises a voltage boosting circuit configured to allow the PV energy system to operate at its maximum power point, regardless of whether the corresponding PV module is subjected to shading or other factors that can limit the voltage.

17. The PV energy system according to claim 1, wherein each PV module cannot produce an output voltage or an output current until the current unfolding circuit presents a voltage to the pulsating bus.

18. The PV energy system according to claim 1, wherein each PV module and the current unfolding circuit together are configured to provide compatibility with traditional PV inverters if the pulsating bus becomes DC.

19. The PV energy system according to claim 1, wherein the plurality of PV modules is configured to provide constant power suitable for use with three-phase PV energy systems.

20. The PV energy system according to claim 1, wherein at least one PV module is configured with a different power rating than at least one other PV module while retaining interchangeability of PV modules in the absence of PV energy system modifications to accommodate the interchangeability of the PV modules such that the PV energy system maximizes available roof space used to attach the PV energy system.

21. The PV energy system according to claim 1, wherein the plurality of PV modules are configured to provide a plurality of PV arrays having dissimilar directional orientations such that the PV energy system provides increased sun tracking capability and energy harvesting capability beyond that achievable with a conventional PV energy system having all PV modules oriented in the same direction.

* * * * *